United States Patent [19]

Brandenburg et al.

[11] Patent Number: 5,774,342
[45] Date of Patent: Jun. 30, 1998

US005774342A

[54] ELECTRONIC CIRCUIT WITH INTEGRATED TERMINAL PINS

[75] Inventors: Scott David Brandenburg; Jeffery Ralph Daanen, both of Kokomo, Ind.

[73] Assignee: Delco Electronics Corporation, Kokomo, Ind.

[21] Appl. No.: 721,396

[22] Filed: Sep. 26, 1996

[51] Int. Cl.⁶ .................................................. H01R 13/08
[52] U.S. Cl. ..................... 361/774; 361/707; 361/711; 361/719; 361/750; 361/752; 361/767; 439/76.1; 439/485; 174/52.4; 257/775
[58] Field of Search ................................ 361/704, 707, 361/709, 711, 717–719, 748–750, 752, 767, 768, 774, 813; 439/76.1, 485; 174/52.1, 52.4; 257/708, 775

[56] References Cited

U.S. PATENT DOCUMENTS

| | | | |
|---|---|---|---|
| 3,585,455 | 6/1971 | Naylor | 361/775 |
| 4,470,648 | 9/1984 | Davis et al. | 174/52.2 |
| 4,713,634 | 12/1987 | Yamamura | 361/752 |
| 4,806,704 | 2/1989 | Belke, Jr. et al. | 174/52.4 |
| 5,132,877 | 7/1992 | Branan et al. | 439/76.1 |
| 5,253,144 | 10/1993 | Schonberger et al. | 439/76.1 |
| 5,353,194 | 10/1994 | Libretti et al. | 361/707 |
| 5,616,886 | 4/1997 | Romero et al. | 174/52.4 |
| 5,668,698 | 9/1997 | Jozwiak et al. | 361/752 |

*Primary Examiner*—Leo P. Picard
*Assistant Examiner*—John B. Vigushin
*Attorney, Agent, or Firm*—Jimmy L. Funke

[57] ABSTRACT

Thin circuit pathways of an electronic circuit are integral with thick terminal pins. The thin and thick portions are stamped, formed and chemically etched from a single sheet of copper or copper alloys, and mounted on a substrate to eliminate the need of a separate header. Components are soldered to the thin pathways in the conventional manner and a housing is molded to the circuit or a preformed housing is attached to the circuit. In another embodiment, a filtered header which contains thin circuit pathways integral with thick terminal pins is formed in the same manner and includes filtering components.

5 Claims, 2 Drawing Sheets

U.S. Patent     Jun. 30, 1998     Sheet 1 of 2     5,774,342
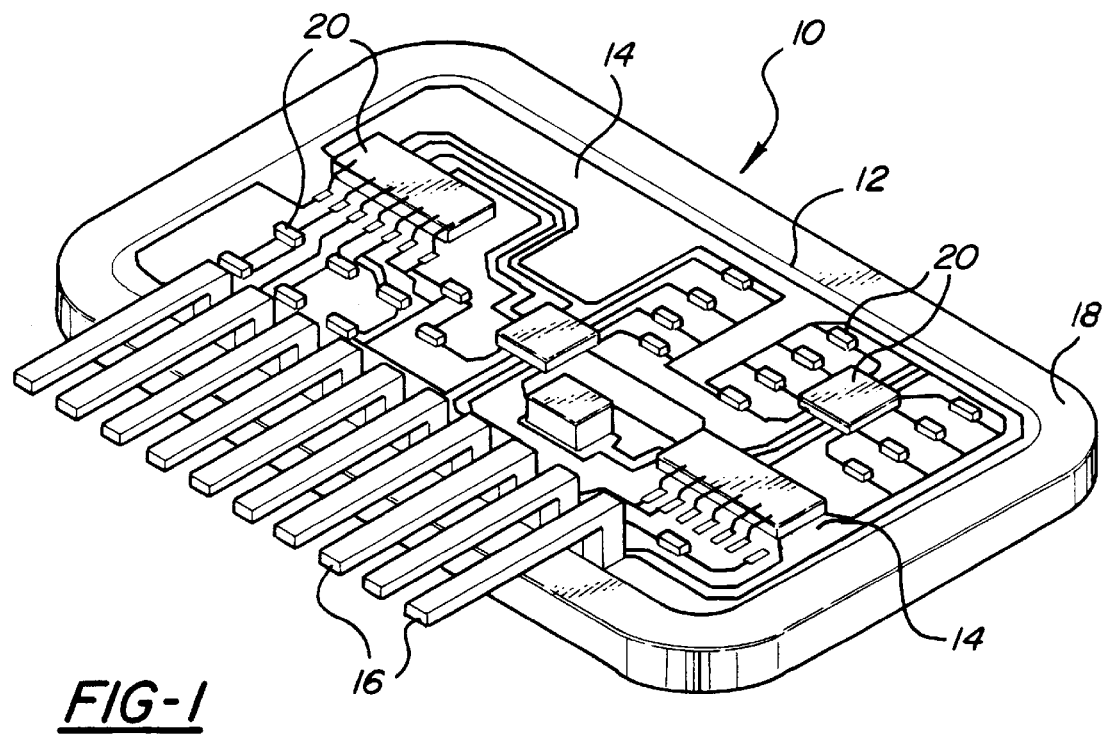
FIG-1
FIG-2
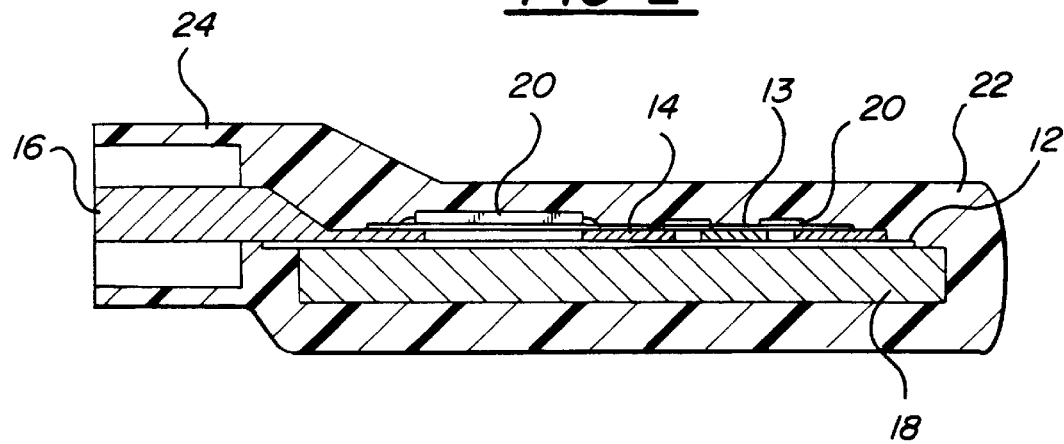

ELECTRONIC CIRCUIT WITH INTEGRATED TERMINAL PINS

FIELD OF THE INVENTION

This invention relates to electronic circuits and particularly to the terminal connectors of such circuits.

BACKGROUND OF THE INVENTION

Electronic circuit packages such as those used in automotive vehicles and harsh environments include a circuit encased in a housing and having a header comprising a plurality of terminal pins for connection to external devices. The circuit often consists of a circuit board or a flexible circuit with attached components mounted on a backplate which may serve as a heat sink. The header is mechanically attached to the circuit and each terminal pin is electrically connected to a circuit runner. That connection as well as the component attachment is usually accomplished by reflow soldering, wave soldering or wire bonding. A housing is molded around the circuit and header assembly or a preformed housing is attached to the assembly.

The manufacture of the header comprises forming the pins, assembling the pins into the desired array and molding an insulating body around the pins. In some cases the header includes filtering components and thus constitutes a circuit in itself, requiring the extra step of assembling the components to the header.

Problems with the usual packaging techniques are first, the integrity of the pin connections to the circuit, and second, the expense of the complicated manufacturing process of attaching the connector header pins to the circuit board, i.e., through wave soldering or wire bonding.

It has been known to form interconnect jumpers between circuit boards by an array of thin conductors on a flexible substrate and terminating in rigid terminal pins which are integral with the thin conductors. Chemical milling is used to sculpt the thin conductors and thick terminal pins from a single sheet of copper. It is desirable to extend that technology to address the problem of pin connection to the thin pathways of electronic circuits.

SUMMARY OF THE INVENTION

It is therefore an object of the invention to simplify a circuit assembly by integrating the connector pins with the circuit pathways. Another object is to integrate the terminal pins of a header with circuit pathways of a circuit. A further object is to integrate terminal pins with conductors in a filtered header.

The invention is carried out by a conductive pattern having thick rigid portions serving as terminal pins and integral thin flexible portions for circuit pathways. The thick and thin portions are formed as one part from a single sheet by stamping, rolling and subsequently etching to reduce the thickness of a portion of the sheet and to define the circuit paths. The thin portions are adhered to an insulating substrate, components are assembled to the circuit pathways and a housing is molded over the assembly with the pins exposed, or a preformed housing is secured to the assembly. The substrate is a rigid insulating board or a flexible film which can be supported on a backplate. Thus the connector terminals are of the same part as the main circuit and no electrical connections are needed.

The invention can also be carried out by a header which includes a circuit carrying components to serve a filtering function. The header comprises thick terminal pin portions integral with thin circuit pathways, and the pathways connect to filtering components and have sites for attachment to the conductors of a main circuit by means of pressure contact, an isotropic adhesive, or hot bar soldering.

BRIEF DESCRIPTION OF THE DRAWINGS

The above and other advantages of the invention will become more apparent from the following description taken in conjunction with the accompanying drawings wherein like references refer to like parts and wherein:

FIG. 1 is an isometric view of a circuit assembly according to the invention;

FIG. 2 is a cross section through another circuit assembly according to the invention;

DESCRIPTION OF THE INVENTION

Figure 3:
FIG. 3 is a side view of starting material for the terminals and pathways of the circuit assembly of FIG. 2.

Referring to FIGS. 1 and 2, an electronic circuit 10 includes a flexible substrate 12 such as a polyimide film, carrying circuit pathways 14 integrally connected to terminal pins 16. The substrate 12 is mounted on a rigid backplate 18 which supports the circuit and serves as a heat sink as well. The backplate may be aluminum, for example. Electronic components 20 are attached to the pathways 14 by solder joints. The terminal pins 16 extend beyond the edge of the backplate 18 and may be straight, as in FIG. 2, such that one side of the pins is coplanar with one side of the pathways 14, or the pins may be formed with an offset so that they reside in a plane above (as in FIG. 1) or below that of the pathways. The pins extend beyond the edges of the substrate and the backplate. Alternatively, the pins may extend normal to the backplate. A housing 22 is molded around the circuit and includes a shroud 24 surrounding the pins 16 to form a connector header.

It will be apparent that by forming the terminals and pathways in one piece, the connection of the header terminals to the circuit board is eliminated, both improving circuit integrity and reducing the number of parts to be assembled.

Figure 4:
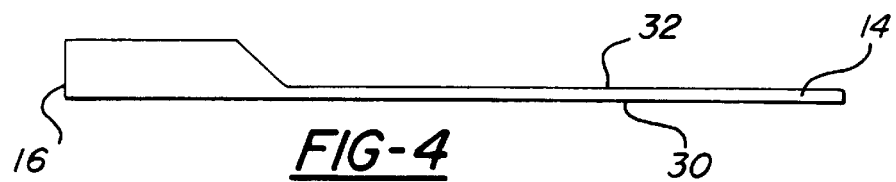
FIG. 4 is a side view of the terminals and pathways of the circuit assembly of FIG. 2.
Figure 5:
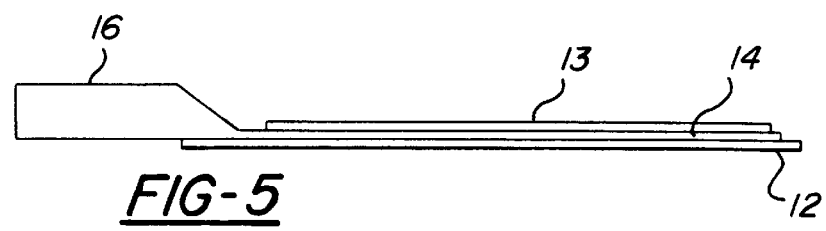
FIG. 5 is a side view of the terminals and pathways of the circuit assembly of FIG. 2 with flexible substrate applied.

The integrated circuit pathway and terminal pin combination is preferably formed by chemically milling in a well known manner. Starting with a sheet 26 of copper having a thickness depending on the desired pin size, say, 32 mils thick, as in FIG. 3, part of the sheet is etched to reduce its thickness to the desired thickness of the circuit, say 4 or 5 mils, as shown in FIG. 4, as well as to define the circuit pathways 14 in the thin part. At that stage, the lower (unetched) surface of the pathways and pins resides in a first plane 30 and the upper side of the pathways define a second plane 32. The thick pins 16 extend above the second plane 32. The pin separation may be accomplished by prior mechanical forming or by etching. As shown in FIG. 5, a polyimide or other insulating film 12 is adhesively applied to the lower surface of the pathways 14 and extends into the thick terminal portion enough to insulate the circuit from the backplate 18. Another insulating film 13 is applied to the upper surface of the pathways and includes apertures to allow attachment of the components. Pin forming, if desired, is performed to produce offsets in the pins or a change of pin direction. The components 20 are attached to the pathways 14 by a conventional method such as reflow soldering.

Figure 6:
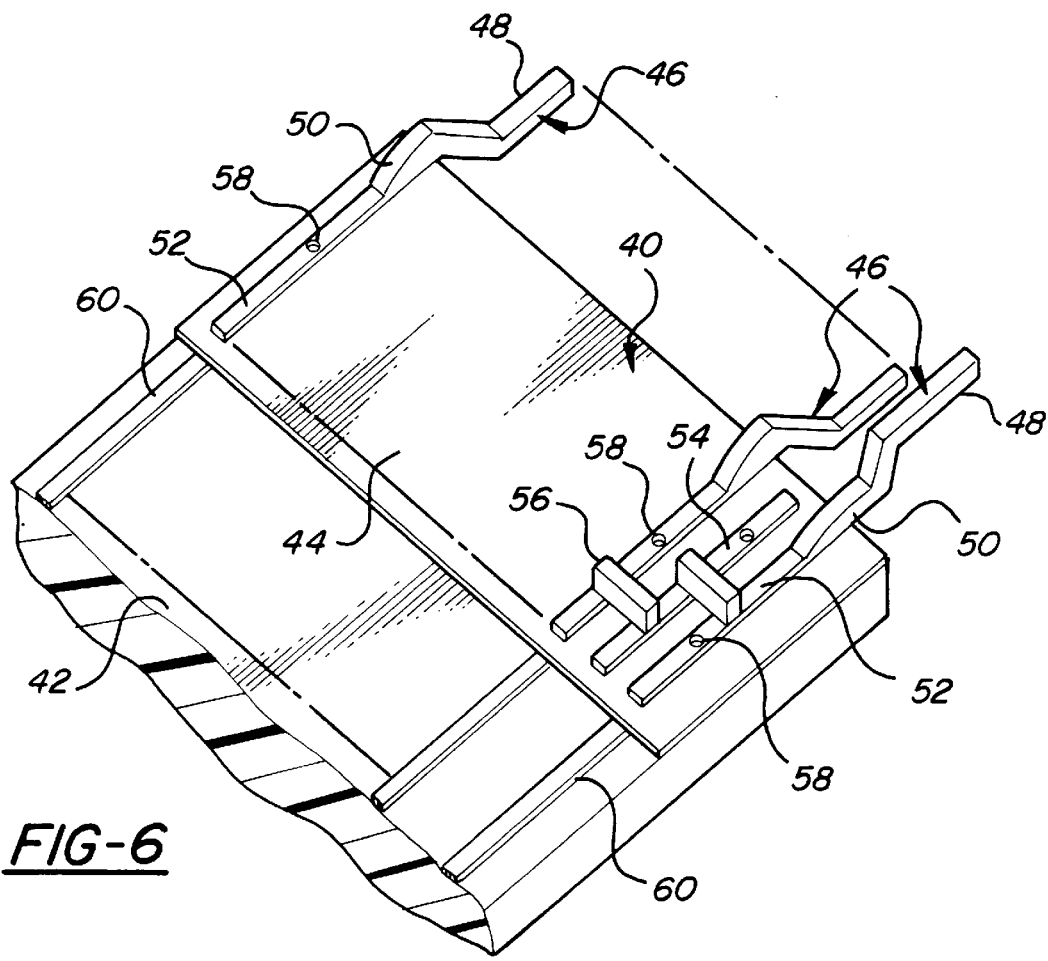
FIG. 6 is an isometric view of a circuit board header on a main circuit board according to another embodiment of the invention.

FIG. 6 shows a filtered header 40 attached to a main circuit board 42. The filtered header comprises a flexible substrate 44 such as a polyimide film carrying an array of terminal pins 46. Each terminal pin 46 comprises a thick rigid outer end 48 which extends beyond the edge of the substrate 44 and is formed in accordance with a desired pin configuration, and an inner end 50 which tapers down to merge with an integral thin circuit pathway 52 on the substrate 44. A thin ground runner 54 between the pathways 52 is connected to the pathways by filter components 56. The components 56 preferably comprise surface mount capacitor chips soldered to the pathways 52 to afford an EMI filtering function although resistive elements may also be used. Vias 58 through the pathways connect to circuit paths 60 on the main circuit board 42. Other means of connecting to the paths 60 may be used such as providing holes in the substrate 44 to allow solder connections directly between the header circuits and the main circuit board. Thus the header 40 comprises terminal pins integral with thin circuit pathways, thereby eliminating connections between conventional pins and header circuits used in conventional filtered headers.

It will thus be recognized that by forming the connector pins integral with thin circuit pathways solder connections and/or wire bonding between pins and the circuitry are avoided, thus improving circuit integrity, reducing part count and simplifying the manufacture of the electronic circuits.

The embodiments of the invention in which an exclusive property or privilege is claimed are defined as follows:

1. An electronic circuit comprising:

a plurality of conductors mounted on a substrate;

each conductor having a thin conductive pathway integral with a thick rigid terminal pin at one end composed solely of conductive material;

the terminal pins being arranged in a connector array; and electrical components connected to the conductive pathways.

2. The invention as defined in claim 1 wherein:

each conductor has a planar side mounted to the substrate in a first plane, the planar side being shared by the thin pathway and the thick terminal pin;

the thin pathway being bounded by the first plane and a second plane parallel to the first plane; and the thick terminal pin extends beyond the second plane.

3. The invention as defined in claim 1 wherein:

the thin pathway comprises a flexible circuit;

the substrate comprises an insulating film which is secured to a backplate; and the terminal pins extend beyond the substrate.

4. The invention as defined in claim 1 wherein:

the electronic circuit is a filtered header for connection to a circuit board; and the electrical components comprise filter elements.

5. The invention as defined in claim 1 wherein:

the electronic circuit is a filtered header for connection to a circuit board;

the substrate comprises a flexible insulating film; and the electrical components include capacitive elements connected to the pathways.

* * * * *